US012665045B2

(12) United States Patent
Shiah

(10) Patent No.: US 12,665,045 B2
(45) Date of Patent: Jun. 23, 2026

(54) MEMORY DEVICE

(71) Applicant: Etron Technology, Inc., Hsinchu (TW)

(72) Inventor: Chun Shiah, Hsinchu (TW)

(73) Assignee: Etron Technology, Inc., Hsinchu (TW)

( * ) Notice: Subject to any disclaimer, the term of this patent is extended or adjusted under 35 U.S.C. 154(b) by 105 days.

(21) Appl. No.: 18/671,964

(22) Filed: May 22, 2024

(65) Prior Publication Data

US 2024/0395355 A1 Nov. 28, 2024

Related U.S. Application Data

(60) Provisional application No. 63/468,278, filed on May 23, 2023.

(51) Int. Cl.
*G11C 29/56* (2006.01)

(52) U.S. Cl.
CPC .. *G11C 29/56016* (2013.01); *G11C 29/56004* (2013.01); *G11C 2029/5602* (2013.01)

(58) Field of Classification Search
CPC ........ G11C 29/56016; G11C 29/56004; G11C 2029/5602; G11C 29/48
See application file for complete search history.

(56) References Cited

U.S. PATENT DOCUMENTS

| | | | | | |
|---|---|---|---|---|---|
| 5,818,086 A | * | 10/1998 | Lin | ........................ | H10D 89/60 257/355 |
| 6,867,993 B2 | * | 3/2005 | Ohshima | ................ | G11C 5/066 365/201 |
| 2004/0039863 A1 | * | 2/2004 | Isom, III | ............. | G06F 11/2005 710/305 |

\* cited by examiner

*Primary Examiner* — Mohammed A Bashar
(74) *Attorney, Agent, or Firm* — JCIPRNET

(57) ABSTRACT

A memory device is provided. The memory device includes: a package substrate; a memory chip, with chip inputs/ outputs (I/Os), and attached to the package substrate; and package terminals, disposed on the package substrate, and having: functional package terminals, connected to the chip I/Os; no-connect (NC) package terminals, arranged among the functional package terminals and not connected to any of the chip I/Os; and redesigned NC package terminals, as additional ones of the NC package terminals but connected to the chip I/Os, so as to be functioned as additional functional package terminals.

17 Claims, 8 Drawing Sheets

10

MEMORY DEVICE

CROSS-REFERENCE TO RELATED APPLICATION

This application claims the priority benefit of U.S. provisional application Ser. No. 63/468,278, filed on May 23, 2023. The entirety of the above-mentioned patent application is hereby incorporated by reference herein and made a part of this specification.

BACKGROUND

Technical Field

Embodiments of the present disclosure are related to a memory device, and more particularly, to a memory device with some no-connect (NC) terminals redesigned to be connected to internal circuits of a memory chip in the memory device.

Description of Related Art

In general, a memory chip can be accessed via chip inputs/outputs (I/Os) exposed at its surface, and is encapsulated in a package structure. The chip I/Os are routed to package I/Os of the package structure, and the package I/Os can engage with another device or package component. In additional to functional package I/Os (also referred to as functional terminals) that are connected to internal circuits of the memory chip, the package I/Os may further include no-connect (NC) package I/Os (also referred to no-connect (NC) terminals), which are not connected to the internal circuits of the memory chip and may be designed for device grounding and/or other purposes.

Along with rapid growth of semiconductor industry, performance and/or functionality of memory chips have been greatly enhanced. As a consequence, more chip I/Os and functional terminals are required. However, according to widely used memory standards (e.g., Joint Electron Device Engineering Council (JEDEC) memory standards), amount of certain functional terminals and a total amount of the functional terminals and the NC terminals for a certain type of memory product (e.g., a double data rate (DDR/DDR1) dynamic random access memory (DRAM)) is fixed. A solution for increasing the amount of the functional terminals while still complying with the memory standards is required in the art.

SUMMARY

In an aspect of the present disclosure, a memory device is provided. The memory device comprises: a package substrate; a memory chip with chip inputs/outputs (I/Os), the memory chip being attached to the package substrate; and package terminals disposed on the package substrate, wherein a total amount of the package terminals is in compliance with Joint Electron Device Engineering Council (JEDEC) memory standard, and the package terminals comprise: functional terminals connected to the chip I/Os; and a first no-connect (NC) terminal originally being designated not to connect the chip I/Os according to the JEDEC memory standard, but being redesigned to connect to a first I/O of the chip I/Os, wherein the redesigned first NC terminal is functioned as one additional functional terminal.

According to some embodiments, the package terminals further comprise second NC terminals arranged among the functional package terminals and not connected to any of the chip I/Os.

According to some embodiments, one of the functional terminals and the redesigned first NC terminal are connected to the first I/O of the chip I/Os.

According to some embodiments, none of the functional terminals is connected to the first I/O of the chip I/Os.

According to some embodiments, the redesigned first NC terminal is connected to an external voltage source, such that a working voltage is supplied to the memory chip through the redesigned first NC terminal and the first I/O of the chip I/Os.

According to some embodiments, the working voltage is supplied to a predetermined circuit of the memory chip through the redesigned first NC terminal and the first I/O of the chip I/Os, wherein the predetermined circuit is a sense amplifier, a decoder, or a refresh circuit.

According to some embodiments, the redesigned first NC terminal is coupled to an additional data signal, an additional command signal or an additional address signal.

According to some embodiments, the redesigned first NC terminal is coupled to the additional data signal, the additional command signal and/or the additional address signal, so as to be configured to enable a test operation or an additional operation to the memory chip.

According to some embodiments, the redesigned first NC terminal is coupled to the additional data signal to redefine a data bandwidth of the memory chip.

According to some embodiments, the redesigned first NC terminal is coupled to the additional command signal, so to be configured to perform a new command not defined by the JEDEC memory standard.

According to some embodiments, the redesigned first NC terminal is coupled to the additional address signal, so as to be configured to redefine a storage capacity of the memory chip.

In another aspect of the present disclosure, a memory device is provided. The memory device comprises: a package substrate; a memory chip with chip inputs/outputs (I/Os), wherein the memory chip is attached to the package substrate; and package terminals disposed on the package substrate, wherein a total amount of the package terminals is in compliance with Joint Electron Device Engineering Council (JEDEC) memory standard, and the package terminals comprise: functional terminals connected to the chip I/Os; and a first set of no-connect (NC) terminals originally being designated not to connect the chip I/Os according to the JEDEC memory standard, but being redesigned to connect to a first set I/Os of the chip I/Os.

According to some embodiments, the package terminals further comprise a second set of NC terminals arranged among the functional package terminals and not connected to any of the chip I/Os.

According to some embodiments, each of the redesigned first set of NC terminals is connected to an external voltage source, an additional data signal, an additional command signal or an additional address signal.

According to some embodiments, at least one of the redesigned first set of NC terminals is connected to the external voltage source, such that a working voltage is supplied to a predetermined circuit of the memory chip through the at least one of the redesigned first set of NC terminals, wherein the predetermined circuit is a sense amplifier, a decoder, or a refresh circuit.

According to some embodiments, the redesigned first set of NC terminals are coupled to additional data signals, an additional command signals or an additional address signals.

According to some embodiments, the redesigned first set of NC terminals are coupled to the additional data signals, so as to be configured to receive a test pattern for the memory device.

According to some embodiments, the redesigned first set of NC terminals are coupled to the additional command signals, so as to be configured to perform new commands not defined by the JEDEC memory standard.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Embodiments of the present disclosure provide a solution for increasing an amount of functional terminals for a memory device, while the memory device still complies with specified memory standards such as JEDEC memory standards.

Figure 1B:
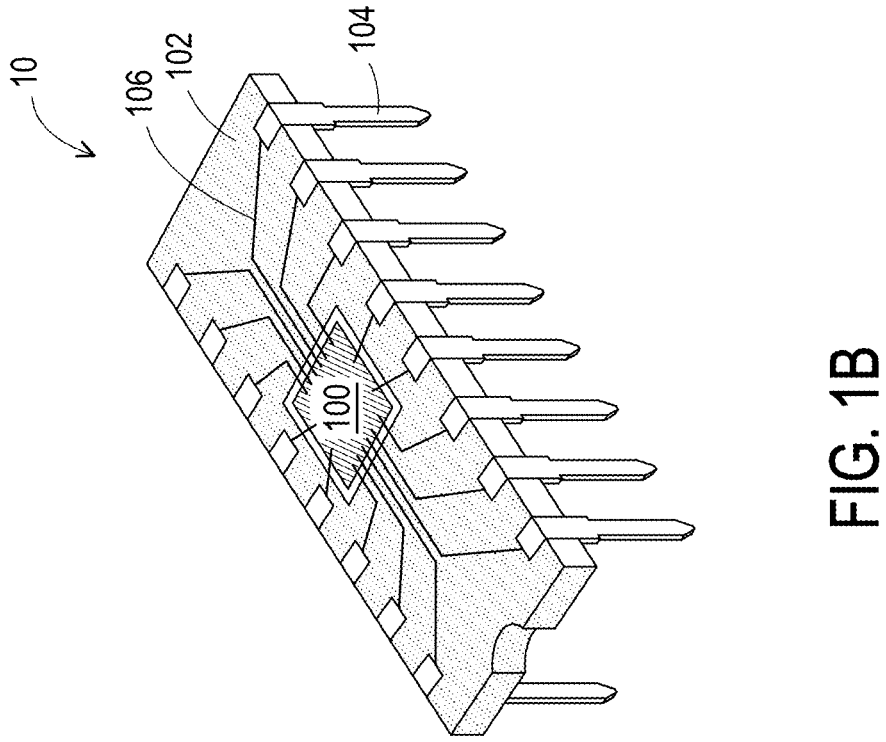
FIG. 1B schematically illustrates the memory device shown in FIG. 1A, with a molding cover omitted.
Figure 1A:
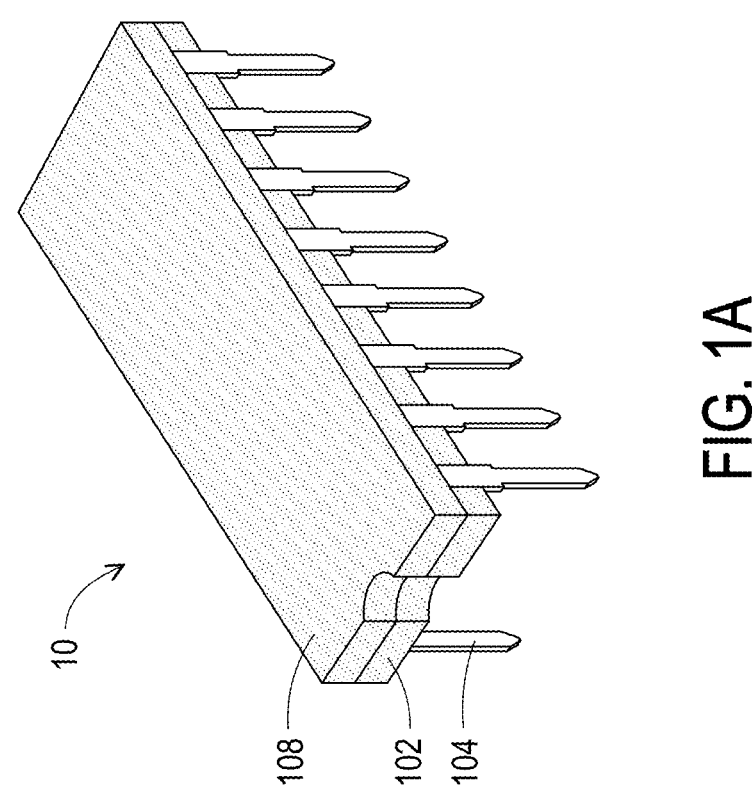
FIG. 1A schematically illustrates a memory device, according to some embodiments of the present disclosure.

FIG. 1A schematically illustrates a memory device 10, according to some embodiments of the present disclosure. To manifest internal structure of the memory device 10, FIG. 1B schematically illustrates the memory device 10 without molding cover 108.

In these embodiments, the memory device 10 includes a memory chip 100 encapsulated in a dual in-line package (DIP). As an example, the memory chip 100 is a DDR1 DRAM chip. Bonding metals (not shown) exposed at a top surface of the memory chip 100 and arranged along edges of the memory chip 100 are connected to internal circuits of the memory chip 100, and are functioned as chip I/Os.

While the memory chip 100 is disposed onto (e.g., mounted onto) a package substrate 102, the bonding metals are connected to package terminals 104 arranged in two parallel rows along opposite sides of the package substrate 102. For instance, bonding wires 106 can be used for implementing the connection of the bonding metals and the package terminals 104. As the package terminals 104 extend vertically out of the package substrate 102, the package terminals 104 may also be referred to as pins, and can engage with another device or package component. In some applications, the package terminals 104 are inserted into a DIP socket on a chip carrier. In other applications, the package terminals 104 can be directly soldered onto a printed circuit board (PCB).

In addition to be routed to the package I/Os, the memory chip 100 is encapsulated by a molding cover 108 after being placed onto the package substrate 102. The molding cover 108 covers the memory chip 100, the package substrate 102 and the package terminals 104. When the bonding metals of the memory chip 100 are connected to the package terminals 104 via the bonding wires 106, the molding cover 108 may wrap around the bonding wires 106.

Although the package terminals 104 are depicted as all being connected to the memory chip 100, actually some of the package terminals 104 are not connected to the memory chip 100, thus are not connected to internal circuits of the memory chip 100. These package terminals 104 may also be referred to as no-connect (NC) terminals. On the other hand, those package terminals 104 connected to the internal circuits of the memory chip 100 may also be referred to as functional terminals.

In addition to other specifications, widely used memory standards (such as the JEDEC memory standards) specify an amount of certain functional terminals as well as a total amount of the functional terminals and the NC terminals for certain memory products. That is, a total amount of the package terminals 104 is specified, and a certain amount of the package terminals 104 should be provided as the functional terminals. On the other hand, others of the package terminals 104 not provided as the functional terminals may be left as the NC terminals.

Figure 1C:
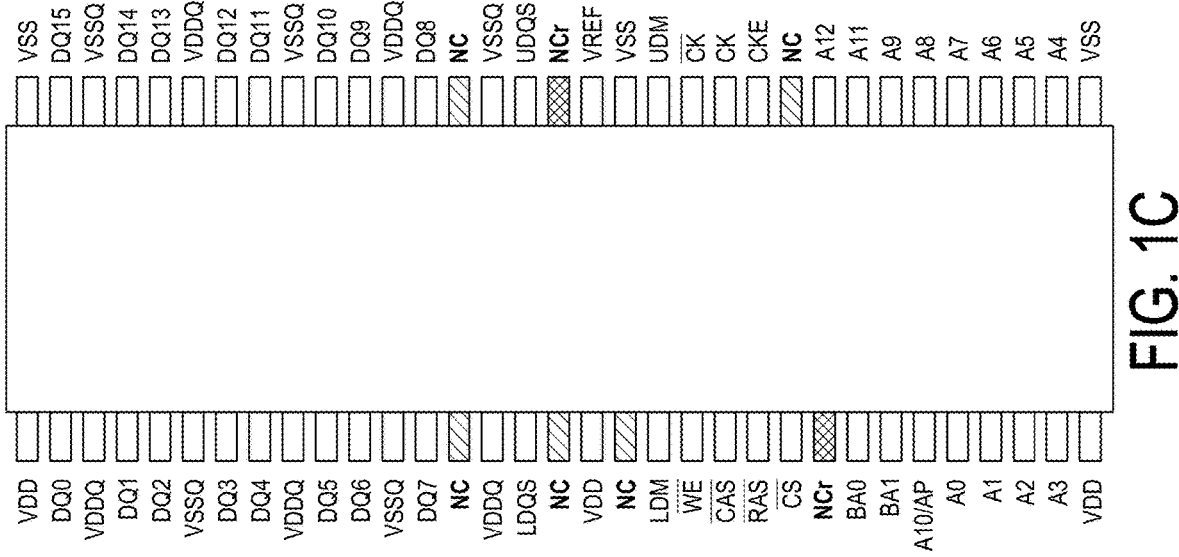
FIG. 1C is a schematic plan view illustrating terminal assignment of the memory device as shown in FIG. 1A, according to some embodiments of the present disclosure.

FIG. 1C is a schematic plan view illustrating terminal assignment of the memory device 10, according to some embodiments of the present disclosure.

As shown in FIG. 1C, according to the JEDEC standards, the memory device 10 may have 66 package terminals 104. Most part of the 66 package terminals 104 are functional terminals. As an example, the functional terminals may include address terminals BA0, BA1, A0, A1, A2, A3, A4, A5, A6, A7, A8, A9, A10/AP, A11, A12, etc; command terminals $\overline{WE}$, $\overline{CAS}$, $\overline{RAS}$, $\overline{CS}$, $\overline{CK}$, CK, CKE, etc; data terminals DQ0, DQ1, DQ2, DQ3, DQ4, DQ5, DQ6, DQ7, DQ8, DQ9, DQ10, DQ11, DQ12, DQ13, DQ14, DQ15, etc; power terminals VDD, VDDQ, VSS, VSSQ, etc; and other functional terminals LDQS, UDQS, LDM, UDM and VREF.

Furthermore, in one embodiment, the package terminals 104 may include 7 NC terminals "NC". These NC terminals NC are arranged among the functional terminals. As described, while functionality and/or performance of the memory chip 100 is/are enhanced, more functional terminals may be required. However, adding more package terminals 104 to provide more functional terminals may result in incompliance with the JEDEC standards, and may lead to incompatibility with the device or package component attached with the memory device 10. According to embodiments of the present disclosure, a solution is provided for increasing an amount of the functional terminals without changing a total amount of the package terminals 104.

Specifically, according to embodiments of the present disclosure, one or more of the NC terminals NC is/are redesigned to be additional functional terminal(s), and is/are labeled as "NCr". In this way, the amount of the functional terminals is increased without altering the total amount of the package terminals 104, and the memory device 10 can still comply with the JEDEC standards.

Figure 1D:
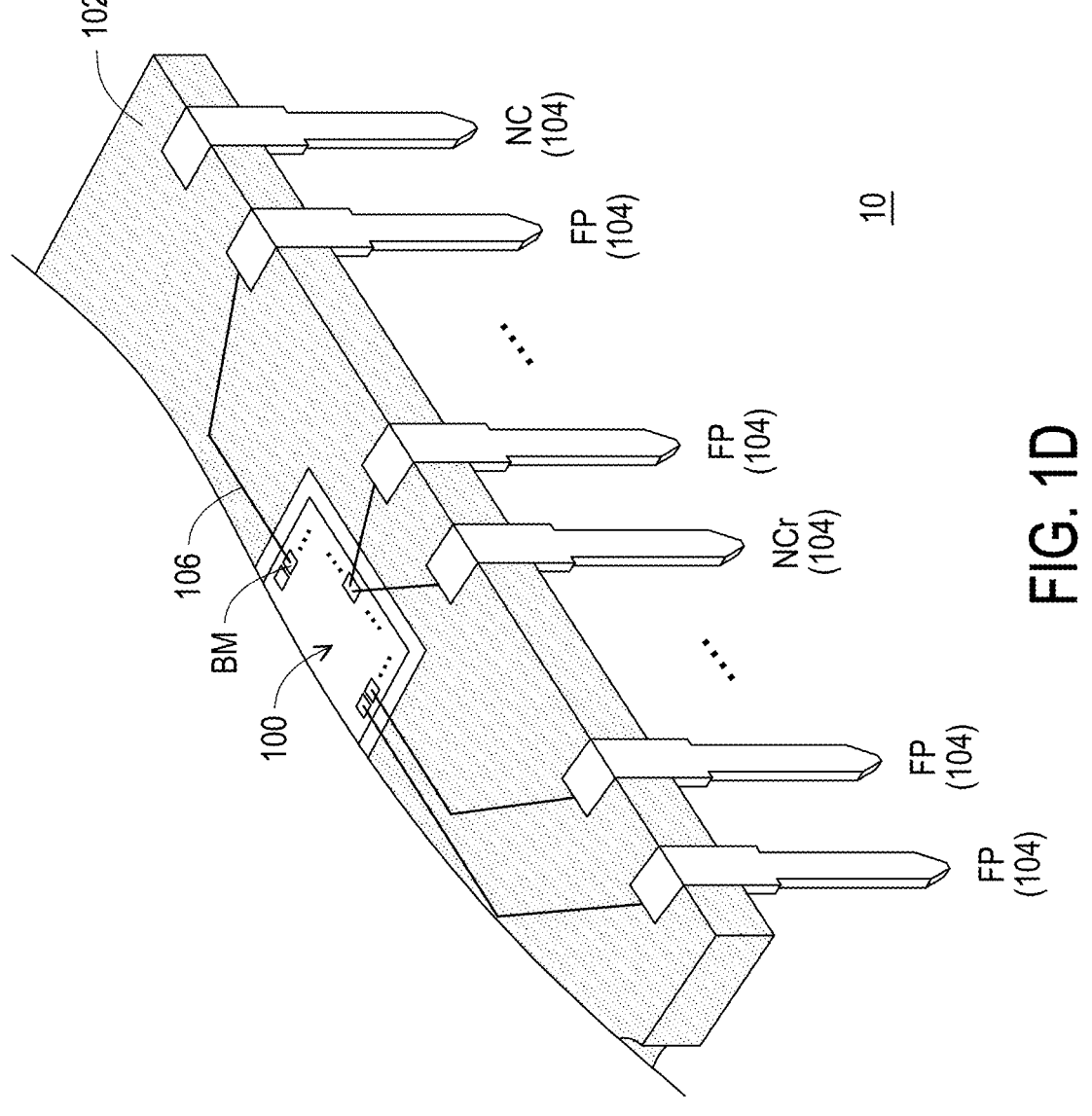
FIG. 1D is a schematic three-dimensional view illustrating connection between the redesigned NC terminal(s) and the memory chip in the memory device as shown in FIG. 1A, according to some embodiments of the present disclosure.

FIG. 1D is a schematic three-dimensional view illustrating connection between the redesigned NC terminal(s) NCr and the memory chip 100, according to some embodiments of the present disclosure.

According to some embodiments as shown in FIG. 1D, the redesigned NC terminal(s) NCr can be respectively connected to one of the bonding metals (labeled as "BM") on the memory chip 100 that is also connected to one of the functional terminals (labeled as "FP"), such as one of the power terminals VDD, VDDQ, VSSQ, VREF or any of the address terminals A0, BA1, A0, A1, A2, A3, A4, A5, A6, A7, A8, A9, A10/AP, A11, A12; the command terminals $\overline{WE}$, $\overline{CAS}$, $\overline{RAS}$, $\overline{CS}$, $\overline{CK}$, CK, CKE; and the data terminals DQ0, DQ1, DQ2, DQ3, DQ4, DQ5, DQ6, DQ7, DQ8, DQ9, DQ10, DQ11, DQ12, DQ13, DQ14, DQ15. In these embodiments, some of the bonding metals BM may be connected to two or more of the package terminals 104, which may include at least one of the functional terminals FP and at least one of the redesigned NC terminals NCr. Meanwhile, others of the bonding metals BM may be respectively connected to one of the functional terminals FP.

Figure 1E:
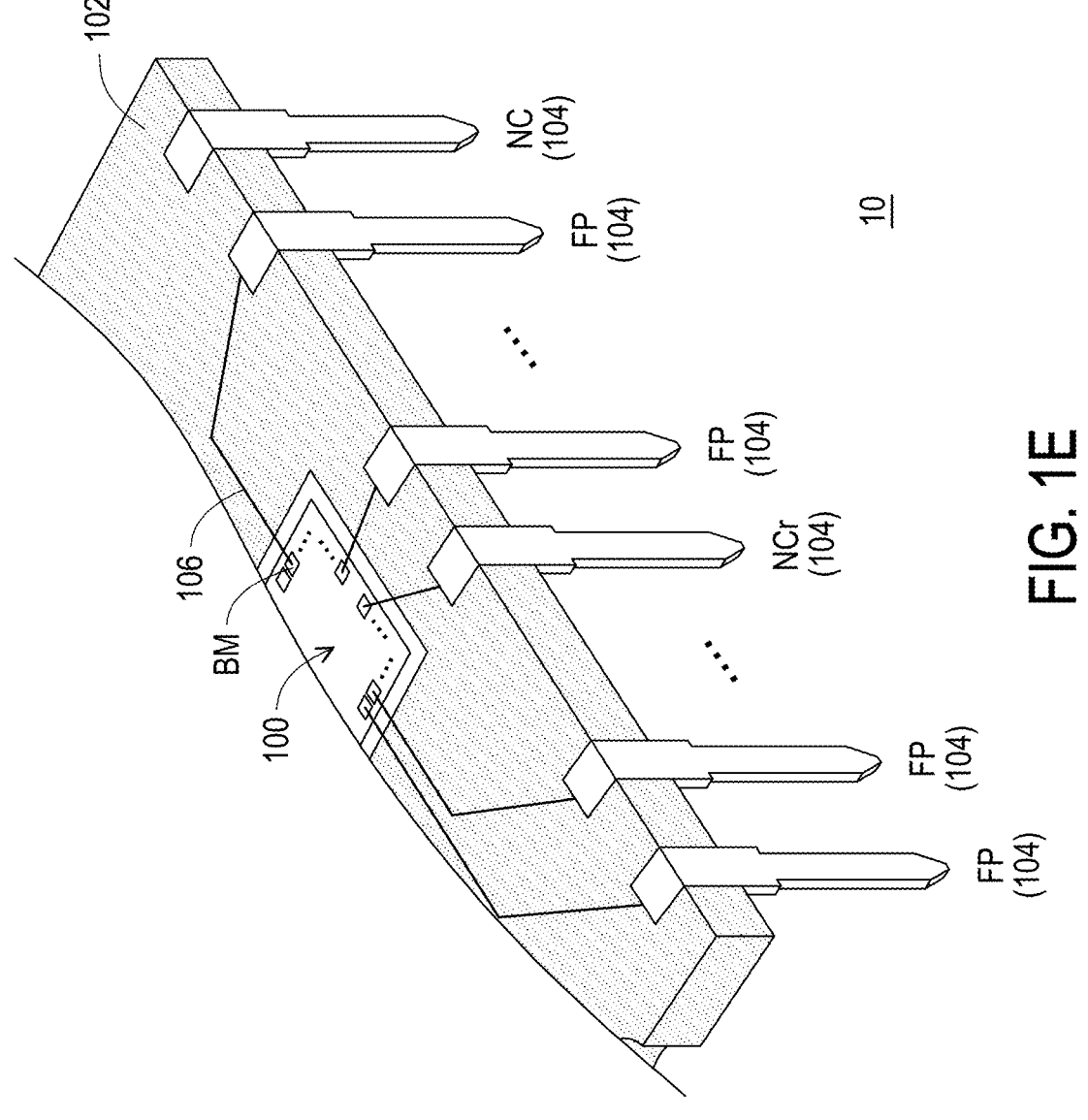
FIG. 1E is a schematic three-dimensional view illustrating connection between the redesigned NC terminal(s) and the memory chip in the memory device as shown in FIG. 1A, according to some alternative embodiments of the present disclosure.

FIG. 1E is a schematic three-dimensional view illustrating connection between the redesigned NC terminal(s) NCr and the memory chip 100, according to some alternative embodiments of the present disclosure.

In these alternative embodiments, the memory chip 100 is designed with additional bonding metal(s) BM, and the redesigned NC terminal(s) NCr is/are connected to the additional bonding metal(s) BM. In this way, the redesigned NC terminal(s) NCr may not have to share bonding metals BM with the functional terminals FP. As an option, the redesigned NC terminal(s) NCr connected to the additional bonding metals BM may be coupled to voltage source(s), such as power supply voltage, ground voltage and/or termination voltage. As another option, the redesigned NC terminal(s) NCr may be coupled to additional data signal(s), address signal(s) and/or command signal(s). Alternatively, some of the redesigned NC terminals NCr may be coupled to the voltage source(s), while others of the redesigned NC terminals NCr may be coupled to the additional data signal(s), address signal(s) and/or command signal(s).

As similar to the connection between the functional terminals FP and the bonding metals BM, connection between the redesigned NC terminals NCr and the bonding metals BM may be implemented by the bonding wires 106.

By coupling the memory chip 100 to the voltage sources (e.g., the power supply voltage, the ground voltage and/or the termination voltage) along additional paths through the redesigned NC terminals NCr, voltage drop from the voltage sources to some circuits of the memory chip 100 (such as, sense amplifiers, decoders, refresh circuits, etc.) can be effectively reduced. Further, these additional paths can provide extra heat dissipation paths, hence heat dissipation efficiency of the memory device 10 can be improved. When some or all of the redesigned NC terminals NCr are functioned as additional data terminals, command terminals and/or address terminals, test operations may be operated through the redesigned NC terminals NCr. It should be appreciated that, other functions can be enabled by using the redesigned NC terminals NCr as well, the present disclosure is not limited thereto. When the redesigned NC terminals NCr are functioned as additional data terminals, data bus width or data bandwidth of the DRAM in the memory chip 100 could be extended or redefined. When the redesigned NC terminals NCr are functioned as additional address terminals, storage capacity of the DRAM in the memory chip 100 (such as an mount of memory banks) could be extended or redefined. In addition, when the redesigned NC terminals NCr are functioned as additional command terminals, new commands originally not defined by the JEDEC memory standard may be introduced, such as row read/row write (that is, read or write a row of data), bank read/bank write (that is, read or write a bank of data), etc.

Figure 2A:
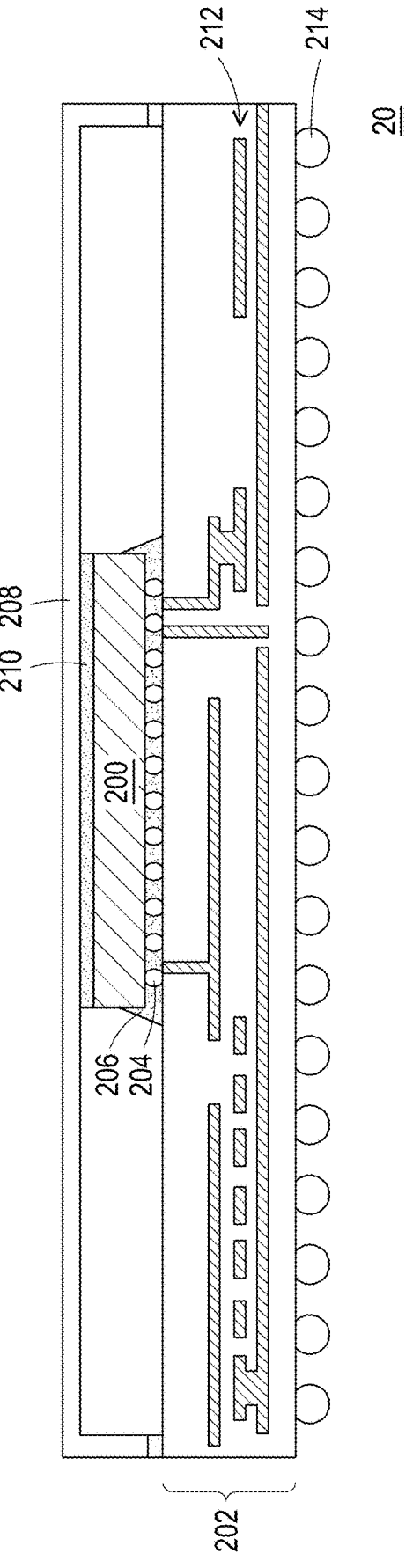
FIG. 2A is a schematic cross-sectional view illustrating a memory device, according to some other embodiments of the present disclosure.

FIG. 2A is a schematic cross-sectional view illustrating a memory device 20, according to some other embodiments of the present disclosure.

According to these embodiments, the memory device 20 includes a memory chip 200 in a ball grid array (BGA) package. Specifically, the memory chip 200 is attached to a package substrate 202 via a flip-chip bonding manner. As adopting flip-chip bonding, the memory chip 200 may be bonded to the package substrate 202 with its front surface facing toward the package substrate 200 and with chip connectors 204 arranged across the front surface being engaged with the package substrate 202. As an example, the memory chip 200 is a DDR3 DRAM chip, and the chip connectors 204 connected to internal circuits of the memory chip 200 and functioned as chip I/Os may be provided by solder bumps.

According to some embodiments, an underfill 206 is provided in a spacing between the front surface of the memory chip 200 and the package substrate 202, and the chip connectors 204 are laterally encapsulated by the underfill 206. Although not shown, an encapsulant may also be provided on the package substrate 202, and the memory chip 200 as well as the underfill 206 may be laterally encapsulated by the encapsulant.

Moreover, in some embodiments, a heat spreader 208 is attached onto the package substrate 202 as well. Sidewall portions of the heat spreader 208 may laterally surround the memory chip 200, and a roof portion of the heat spreader 208 lies over the memory chip 200. A back surface of the memory chip 200 may be attached to the roof portion of the heat spreader 208 via a layer of thermal grease 210. In the example that the memory chip 200 and the underfill 206 are encapsulated by the encapsulant (not shown), the memory chip 200 as well as the encapsulant may be capped by the heat spreader 208.

The package substrate 202 may be provided by a build-up organic substrate with or without a dielectric core layer. Wirings and vias 212 spread in the package substrate 202, for routing the chip connectors 204 to package terminals 214 arranged at a side of the package substrate 202 facing away from the memory chip 200. As an example, the package terminals 214 functioned as package I/Os may be implemented by solder balls.

As similar to the package terminals 104 of the memory device 10 as described with reference to FIG. 1A through FIG. 1E, the package terminals 214 may include functional terminals that are connected to the chip connectors 204 and hence connected to the internal circuits of the memory chip 200, and may also include NC terminals not connected to the chip connectors 204 nor the internal circuits of the memory chip 200. In addition, a total amount of the package terminals 214 is specified in accordance with the JEDEC standards. Also, to be complied with the JEDEC standards, a certain amount of the package terminals 214 should be provided as the functional terminals. On the other hand, others of the package terminals 214 not provided as the functional terminals may be left as the NC terminals.

Figure 2B:
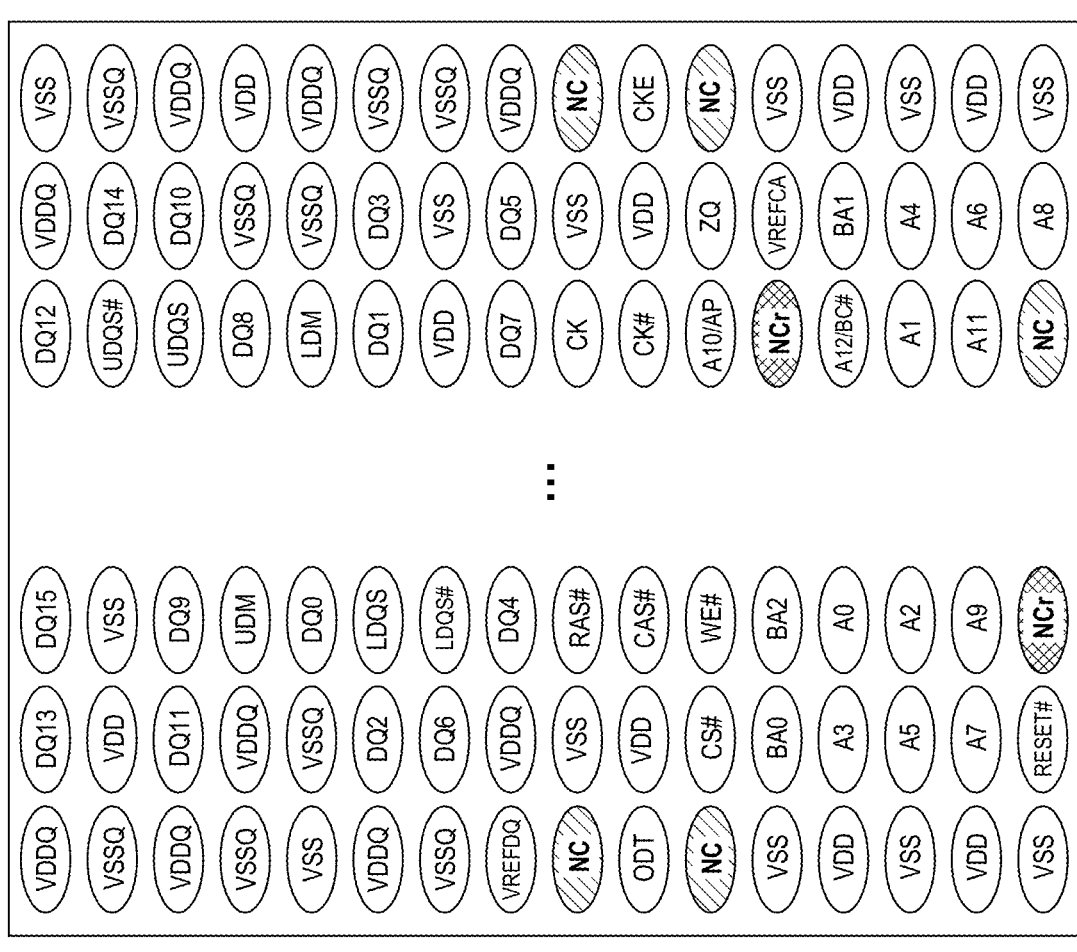
FIG. 2B is a schematic plan view illustrating terminal assignment of the memory device as shown in FIG. 2A, according to some embodiments of the present disclosure.

FIG. 2B is a schematic plan view illustrating terminal assignment of the memory device 20, according to some embodiments of the present disclosure.

As shown in FIG. 2B, according to the JEDEC standards, the memory device 20 with the memory chip 200 implemented by a DDR3 DRAM chip may have 144 package terminals 214. Most of the package terminals 214 are provided as the functional terminals. For instance, the functional terminals may include address terminals BA0, BA1, BA2, A0, A1, A2, A3, A4, A5, A6, A7, A8, A9, A10/AP, A11, A12/BC #; command terminals CS #, RESET #, RAS #, CAS #, CK, CK #, CKE, ODT, WE #; data terminals DQ0, DQ1, DQ2, DQ3, DQ4, DQ5, DQ6, DQ7, DQ8, DQ9, DQ10, DQ11, DQ12, DQ13, DQ14, DQ15, UDQS #, UDQS, DQS, LDM, UDM; and power terminals VDD, VDDQ, VSS, VSSQ, VREFDQ, VREFCA, ZQ.

Furthermore, the package terminals 214 may include 7 NC terminals "NC". In order to increase an amount of the functional bumps without increasing a total amount of the package terminals 214, one or more of the NC terminals NC is/are redesigned to be additional functional terminal(s), and is labeled as "NCr". As an example (but not limited to), two of the NC terminals NC are redesigned to be additional functional terminals. These redesigned NC terminals NCr are connected to the chip connectors 204, and thus are connected to the internal circuits of the memory chip 200.

Figure 2C:
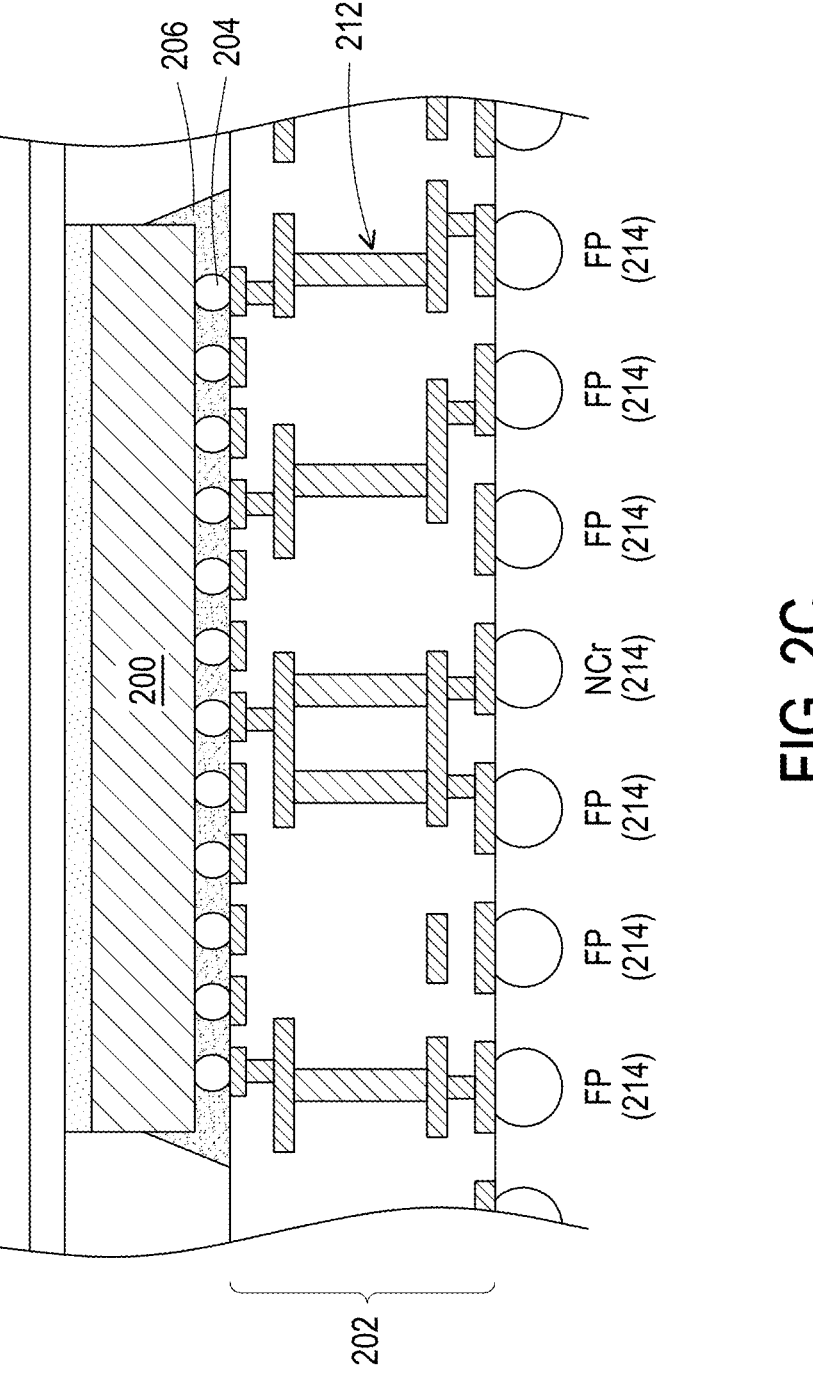
FIG. 2C is a schematic three-dimensional view illustrating connection between the redesigned NC terminal(s) and the memory chip in the memory device as shown in FIG. 2A, according to some embodiments of the present disclosure.

FIG. 2C is a schematic three-dimensional view illustrating connection between the redesigned NC terminal(s) NCr and the memory chip 200, according to some embodiments of the present disclosure.

According to the embodiments as shown in FIG. 2C, the redesigned NC terminal(s) NCr can be respectively connected to one of the chip connectors 204 that is also connected to one of the functional terminals (labeled as "FP"). As an example, each redesigned NC terminal NCr is connected to one of the functional terminals FP which is coupled to a voltage source, such as power supply voltage, ground voltage, reference voltage or termination voltage. In another embodiment, some or all of the redesigned NC terminals NCr are functioned as additional data terminals, command terminals and/or address terminals, test operations may be operated through the redesigned NC terminals NCr. For example, several redesigned NC terminals NCr are functioned as data terminals to receive testing patterns. It should be appreciated that, other functions can be enabled by using the redesigned NC terminals NCr as well, the present disclosure is not limited thereto. For example, the redesigned NC terminals NCr functioned as additional data terminals could extend or redefine the data bus width or data bandwidth of the DRAM. The redesigned NC terminals NCr functioned as additional address terminals could extend to redefine the storage capacity (such as number of the storage banks) of the DRAM. Furthermore, the redesigned NC terminals NCr functioned as additional command terminals may represent new commands originally not defined by the JEDEC memory standard, such as row read/row write (that is, read or write a row of data), bank read/bank write (that is, read or write a bank of data), etc.

In these embodiments, some of the wirings and vias 212 may be shared by each redesigned NC terminal NCr and the connected functional terminal FP. On the other hand, others of the functional terminals FP may be respectively connected to one of the chip connectors 204 via respective groups of the wirings and vias 212. It should be appreciated that the wirings and vias 212 arranged between the chip connectors 204 and the package terminals 214 are schematically depicted, those skilled in the art may arrange the wirings and vias 212 in any of other logical ways, the present disclosure is not limited thereto.

Figure 2D:
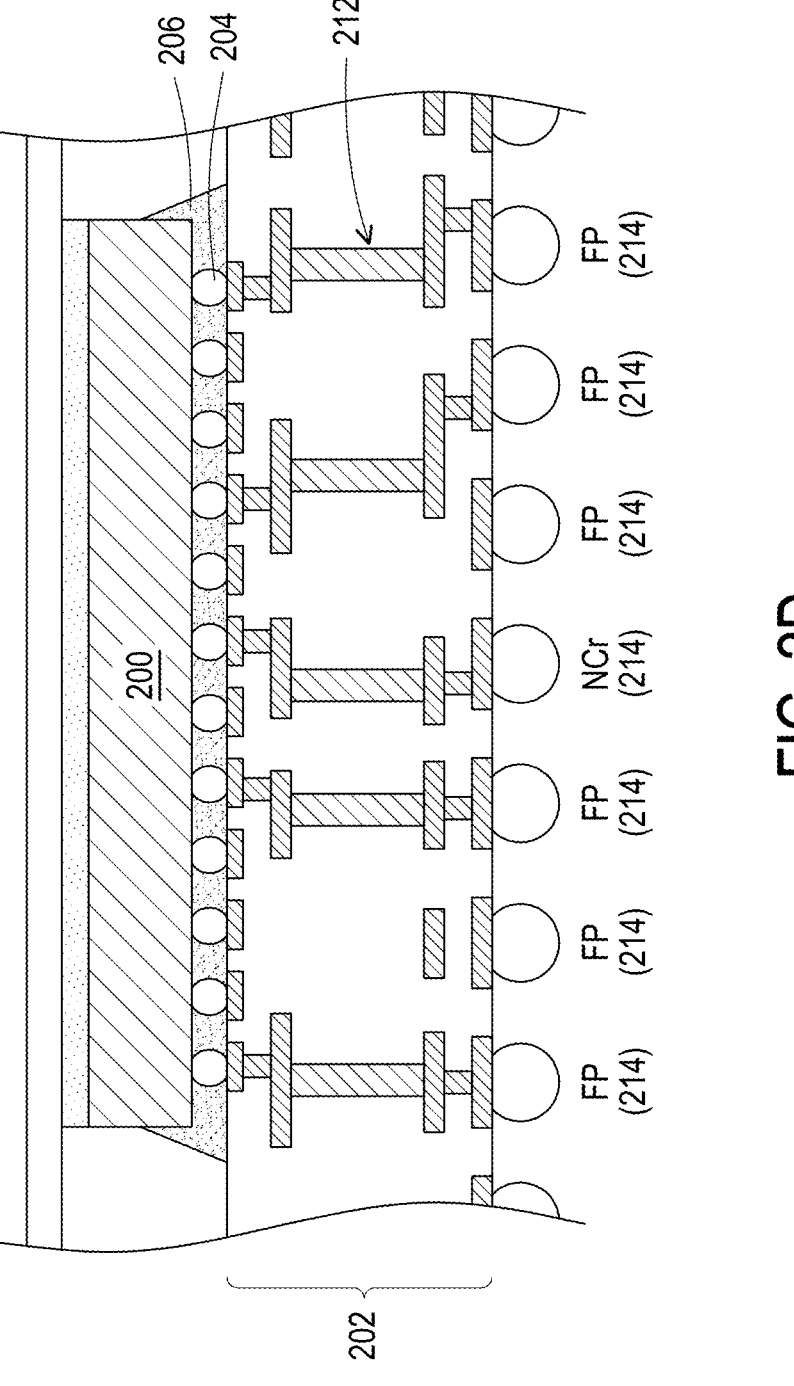
FIG. 2D is a schematic three-dimensional view illustrating connection between the redesigned NC terminal(s) and the memory chip in the memory device as shown in FIG. 2A, according to some alternative embodiments of the present disclosure.

FIG. 2D is a schematic three-dimensional view illustrating connection between the redesigned NC terminal(s) NCr and the memory chip 200, according to some other embodiments of the present disclosure.

In these alternative embodiments, the memory chip 200 is designed with additional chip connector(s) 204, and the redesigned NC terminal(s) NCr is/are connected to the additional chip connector(s) 204. In this way, the redesigned NC terminal(s) NC may not have to share some of the chip connectors 204 (and also the wirings and vias 212) with the functional terminals FP. As an option, the redesigned NC terminal(s) NCr connected to the additional chip connectors 204 may be coupled to voltage source(s), such as power supply voltage, ground voltage and/or termination voltage. As another option, the redesigned NC terminal(s) NCr may be coupled to additional data signal(s), address signal(s) and/or command signal(s). Alternatively, some of the redesigned NC terminals NCr may be coupled to the voltage source(s), while others of the redesigned NC terminals NCr may be coupled to the additional data signal(s), address signal(s) and/or command signal(s).

As above, a memory device with some NC terminals redesigned to be additional functional terminals is provided. Specifically, the memory device includes a memory chip attached to a package substrate. Package terminals arranged at a side of the package substrate facing away from the memory chip may include functional terminals connected to internal circuits of the memory chip, and may also include the NC terminals not connected to the internal circuits of the memory chip. As some of the NC terminals are redesigned to be additional functional terminals, functionality and/or performance of the memory chip can be enhanced, without changing a total amount of the package terminals. In this way, the memory device remains compliance with the JEDEC standards, and should be still compatible with the device or package component attached with the memory device. In another embodiment, the redesigned NC terminals could be used to connect to the internal circuits of the memory chip for thermal dissipation. For example, the redesigned NC terminals could be coupled to thermal vias or thermal plates of the internal circuits of the memory chip.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory device, comprising:
   a package substrate;
   a memory chip with chip inputs/outputs (I/Os), the memory chip being attached to the package substrate; and package terminals disposed on the package substrate, wherein a total amount of the package terminals is in compliance with Joint Electron Device Engineering Council (JEDEC) memory standard, and the package terminals comprise:

functional terminals connected to the chip I/Os; and a first no-connect (NC) terminal originally being designated not to connect the chip I/Os according to the JEDEC memory standard, but being redesigned to connect to a first I/O of the chip I/Os, wherein the redesigned first NC terminal is functioned as one additional functional terminal, wherein the redesigned first NC terminal is configured for an additional data signal, an additional command signal or an additional address signal, which is different from data signals, command signals or address signals coupled to the functional terminals.

2. The memory device according to claim 1, wherein the package terminals further comprise second NC terminals arranged among the functional package terminals and not connected to any of the chip I/Os.

3. The memory device according to claim 1, wherein one of the functional terminals and the redesigned first NC terminal are connected to the first I/O of the chip I/Os.

4. The memory device according to claim 1, wherein none of the functional terminals is connected to the first I/O of the chip I/Os.

5. The memory device according to claim 1, wherein the working voltage is supplied to a predetermined circuit of the memory chip through the redesigned first NC terminal and the first I/O of the chip I/Os, wherein the predetermined circuit is a sense amplifier, a decoder, or a refresh circuit.

6. The memory device according to claim 1, wherein the redesigned first NC terminal is coupled to the additional data signal, the additional command signal and/or the additional address signal, so as to be configured to enable a test operation or an additional operation to the memory chip.

7. The memory device according to claim 1, wherein the redesigned first NC terminal is coupled to the additional data signal to redefine a data bandwidth of the memory chip.

8. The memory device according to claim 1, wherein the redesigned first NC terminal is coupled to the additional command signal, so to be configured to perform a new command not defined by the JEDEC memory standard.

9. The memory device according to claim 1, wherein the redesigned first NC terminal is coupled to the additional address signal, so as to be configured to redefine a storage capacity of the memory chip.

10. A memory device, comprising:

a package substrate;

a memory chip with chip inputs/outputs (I/Os), wherein the memory chip is attached to the package substrate; and package terminals disposed on the package substrate, wherein a total amount of the package terminals is in compliance with Joint Electron Device Engineering Council (JEDEC) memory standard, and the package terminals comprise:

functional terminals connected to the chip I/Os; and a first set of no-connect (NC) terminals originally being designated not to connect the chip I/Os according to the JEDEC memory standard, but being redesigned to connect to a first set I/Os of the chip I/Os, wherein the redesigned first set of NC terminals are configured for additional data signals, additional command signals or additional address signals, which are different from data signals, command signals or address signals coupled to the functional terminals.

11. The memory device according to claim 10, wherein the package terminals further comprise a second set of NC terminals arranged among the functional package terminals and not connected to any of the chip I/Os.

12. The memory device according to claim 10, wherein each of the redesigned first set of NC terminals is connected to an external voltage source, the additional data signal, the additional command signal or the additional address signal.

13. The memory device according to claim 12, wherein at least one of the redesigned first set of NC terminals is connected to the external voltage source, such that a working voltage is supplied to a predetermined circuit of the memory chip through the at least one of the redesigned first set of NC terminals, wherein the predetermined circuit is a sense amplifier, a decoder, or a refresh circuit.

14. The memory device according to claim 10, wherein the redesigned first set of NC terminals are coupled to the additional data signals, so as to be configured to receive a test pattern for the memory device.

15. The memory device according to claim 10, wherein the redesigned first set of NC terminals are coupled to the additional command signals, so as to be configured to perform new commands not defined by the JEDEC memory standard.

16. A memory device, comprising:

a package substrate;

a memory chip with chip inputs/outputs (I/Os), the memory chip being attached to the package substrate; and package terminals disposed on the package substrate, wherein a total amount of the package terminals is in compliance with Joint Electron Device Engineering Council (JEDEC) memory standard, and the package terminals comprise:

functional terminals connected to the chip I/Os; and a first no-connect (NC) terminal originally being designated not to connect the chip I/Os according to the JEDEC memory standard, but being redesigned to couple to a thermal via or a thermal plate of the memory chip.

17. A memory device, comprising:

a package substrate;

a memory chip with chip inputs/outputs (I/Os), the memory chip being attached to the package substrate; and package terminals disposed on the package substrate, wherein a total amount of the package terminals is in compliance with Joint Electron Device Engineering Council (JEDEC) memory standard, and the package terminals comprise:

functional terminals connected to the chip I/Os; and a first no-connect (NC) terminal originally being designated not to connect the chip I/Os according to the JEDEC memory standard, but being redesigned to connect to a first I/O of the chip I/Os, wherein the redesigned first NC terminal is functioned as one additional functional terminal, wherein the redesigned first NC terminal is connected to an external voltage source, such that a working voltage is supplied to the memory chip through the redesigned first NC terminal and the first I/O of the chip I/Os.

* * * * *